(12) United States Patent
Koutari

(10) Patent No.: US 7,529,080 B2
(45) Date of Patent: May 5, 2009

(54) ELECTRONIC DEVICE AND ELECTRONIC SYSTEM

(75) Inventor: Hiroshi Koutari, Kobe (JP)

(73) Assignee: Fujitsu Ten Limited, Kobe-shi (JP)

( * ) Notice: Subject to any disclaimer, the term of this patent is extended or adjusted under 35 U.S.C. 154(b) by 0 days.

(21) Appl. No.: 12/010,386

(22) Filed: Jan. 24, 2008

(65) Prior Publication Data

US 2008/0180888 A1 Jul. 31, 2008

(30) Foreign Application Priority Data

Jan. 26, 2007 (JP) .............. 2007-017042

(51) Int. Cl.
*H05K 7/14* (2006.01)

(52) U.S. Cl. .................. 361/679; 361/686; 710/303

(58) Field of Classification Search ................ 361/679, 361/686; 710/303
See application file for complete search history.

(56) References Cited

U.S. PATENT DOCUMENTS

| | | | |
|---|---|---|---|
| 5,794,164 A * | 8/1998 | Beckert et al. ............. 455/3.06 |
| 5,917,435 A | 6/1999 | Kamiya et al. |
| 6,125,326 A | 9/2000 | Ohmura et al. |
| 6,417,786 B2 | 7/2002 | Learman et al. |
| 6,421,606 B1 | 7/2002 | Asai et al. |
| 6,681,176 B2 | 1/2004 | Funk et al. |
| 6,754,070 B2 * | 6/2004 | Chen ........................ 361/683 |
| 6,816,783 B2 | 11/2004 | Hashima et al. |
| 6,993,615 B2 | 1/2006 | Falcon |
| 7,062,378 B2 | 6/2006 | Krull et al. |
| 7,079,863 B2 | 7/2006 | Chikaishi |
| 7,117,286 B2 * | 10/2006 | Falcon ........................ 710/303 |
| 7,222,207 B2 | 5/2007 | Falcon |
| 7,375,439 B2 * | 5/2008 | Kobayashi ................. 307/10.1 |
| 2002/0152027 A1 | 10/2002 | Allen |
| 2003/0022624 A1 | 1/2003 | Sato |

FOREIGN PATENT DOCUMENTS

| | | |
|---|---|---|
| JP | A-04-238218 | 8/1992 |
| JP | A-08-318792 | 12/1996 |
| JP | A-10-103999 | 4/1998 |
| JP | A-2000-311029 | 11/2000 |
| JP | A-2001-141471 | 5/2001 |
| JP | A-2001-239895 | 9/2001 |
| JP | A-2002-181555 | 6/2002 |
| JP | A-2002-267461 | 9/2002 |
| JP | A-2002-328026 | 11/2002 |
| JP | A-2003-035554 | 2/2003 |
| JP | A-2003-037514 | 2/2003 |
| JP | A-2003-166848 | 6/2003 |
| JP | A-2003-315065 | 11/2003 |
| JP | A-2005-173653 | 6/2005 |
| JP | A-2005-206007 | 8/2005 |
| JP | A-2005-524570 | 8/2005 |

* cited by examiner

*Primary Examiner*—Lisa Lea-Edmonds
*Assistant Examiner*—Ingrid Wright
(74) *Attorney, Agent, or Firm*—Oliff & Berridge, PLC

(57) ABSTRACT

An electronic device includes: a main unit; a cap unit that is capable of having a portable electronic device attached thereto and is capable of tilting; a driving unit that causes the cap unit to tilt with respect to the main body; and a controlling unit that drives the driving unit so as to return the cap unit to a reference position, when detachment of the portable electronic device from the cap unit is detected.

3 Claims, 14 Drawing Sheets

| NUMBER OF PRESSING TIMES | ANGLE θ | NUMBER OF PULSES |
|---|---|---|
| 0 (REFERENCE POSITION) | 0° | 0 |
| 1 | 5° | 10 |
| 2 | 10° | 20 |
| 3 | 15° | 30 |
| 4 | 20° | 40 |
| 5 | 25° | 50 |
| 6 | 30° | 60 |

| TILT ANGLE | NUMBER OF PULSES |
|---|---|
| 60° | 120 |

| TILT ANGLE | NUMBER OF PULSES |
|---|---|
| 0° | 0 |

| CURRENT TILT ANGLE | OPEN/CLOSED STATE |
|---|---|
| ANGLE θ | OPEN STATE OR CLOSED STATE |

ELECTRONIC DEVICE AND ELECTRONIC SYSTEM

BACKGROUND OF THE INVENTION

1. Field of the Invention

The present invention generally relates to an electronic device, and an electronic system that includes a detachable, portable electronic device and the electronic device.

2. Description of the Related Art

Widely known conventional navigation devices include small-sized portable navigation devices that are called personal navigation devices and can be carried around though simple, and vehicle-mounted navigation devices that are accommodated and secured in the concave portions (DIN openings) formed in the dashboards of vehicles. Each of the vehicle-mounted navigation devices can perform a highly precise guiding operation, with the assistance of information such as vehicle speed information supplied from the vehicle. Some of the newly suggested vehicle-mounted navigation devices are equipped with audio devices.

In recent years, navigation devices that have the portability of the portable navigation devices and the highly sophisticated guiding performance of the vehicle-mounted navigation systems have been developed.

Japanese Unexamined Patent Publication No. 8-318792 (Reference 1), Japanese Unexamined Patent Publication No. 2002-328026 (Reference 2), Published Japanese Translation No. 2005-524570 of the PCT international publication for a patent application (Reference 3), and Japanese Unexamined Patent Publication No. 2001-239895 (Reference 4) disclose structures each having a navigating unit that can be detached from a vehicle-mounted device mounted on a vehicle. Detached from the vehicle-mounted device, the navigating unit can be used as an independent portable navigation device.

Japanese Unexamined Patent Publication No. 2003-166848 (Reference 5) discloses a structure in which a navigation device can be detached from a vehicle, and can be used while the user is walking. While the navigation device is mounted in the vehicle, the navigation device operates in a car navigating mode. When detached from the vehicle, the navigation device operates in a human navigating mode.

However, any of References 1 through 5 neither discloses nor suggests a structure in which a vehicle-mounted device to which a navigating unit is to be attached has a cap unit that can tilt with respect to the vehicle-mounted device main unit.

FIG. 14 shows a conventional structure in which a cap unit 802 tilts with respect to a vehicle-mounted device main unit 801 to which a navigating unit 804 is to be attached. When the navigating unit 804 is attached to the cap unit 802 in a tilting state, excess load is put on a slider 803 for tilting the cap unit 802 and the driving mechanism for driving the slider 803. As a result, the slider 803 and the driving mechanism for the slider 803 might be damaged.

SUMMARY OF THE INVENTION

It is therefore an object of the present invention to provide an electronic device and an electronic system in which the above disadvantages are eliminated.

A more specific object of the present invention is to provide an electronic device and an electronic system that can prevent damage to the structure designed for causing the cap unit to tilt when a portable electronic device is attached to the electronic device.

According to an aspect of the present invention, there is provided an electronic device including: a main unit; a cap unit that is capable of having a portable electronic device attached thereto and is capable of tilting; a driving unit that causes the cap unit to tilt with respect to the main body; and a controlling unit that drives the driving unit so as to return the cap unit to a reference position, when detachment of the portable electronic device from the cap unit is detected.

According to another aspect of the present invention, there is provided an electronic system including: a portable electronic device; and an electronic device that includes: a main unit; a cap unit that is capable of having a portable electronic device attached thereto and is capable of tilting; a driving unit that causes the cap unit to tilt with respect to the main body; and a controlling unit that drives the driving unit so as to return the cap unit to a reference position, when detachment of the portable electronic device from the cap unit is detected.

With this structure, when detachment of the portable electronic device from the cap unit is detected while the cap unit is tilting with respect to the electronic device main unit, the driving unit is controlled so as to put the tilting cap unit back into the original state. Accordingly, when detachment of the portable electronic device from the cap unit is detected, the cap unit is returned from a tilting state to a non-tilting state (the reference position). When the portable electronic device is attached back to the cap unit, the driving unit for driving the cap unit is not damaged, since the cap unit is not tilting. Also, as the cap unit is in a non-tilting state, the portable electronic device can be readily attached to the cap unit.

In accordance with the present invention, damage to the driving unit for causing the cap unit to tilt can be prevented when a portable electronic device is attached to the cap unit.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a description of a preferred embodiment of the present invention, with reference to the accompanying drawings. It should be noted that the scope of the present invention is not limited to the embodiment described below, and is defined in the claims and their equivalents.

Figure 1A:
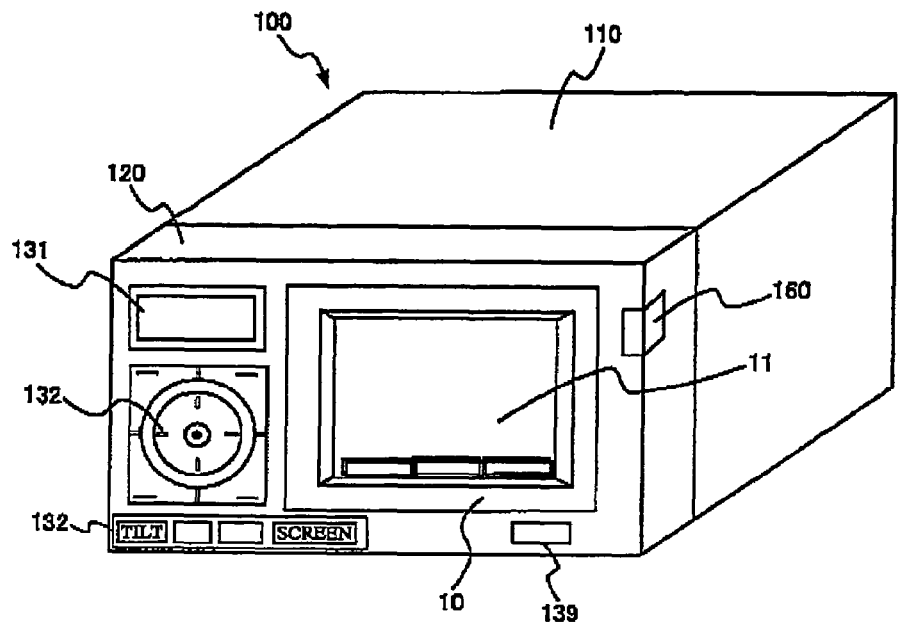
FIGS. 1A and 1B show external views of a vehicle-mounted system.
Figure 1B:
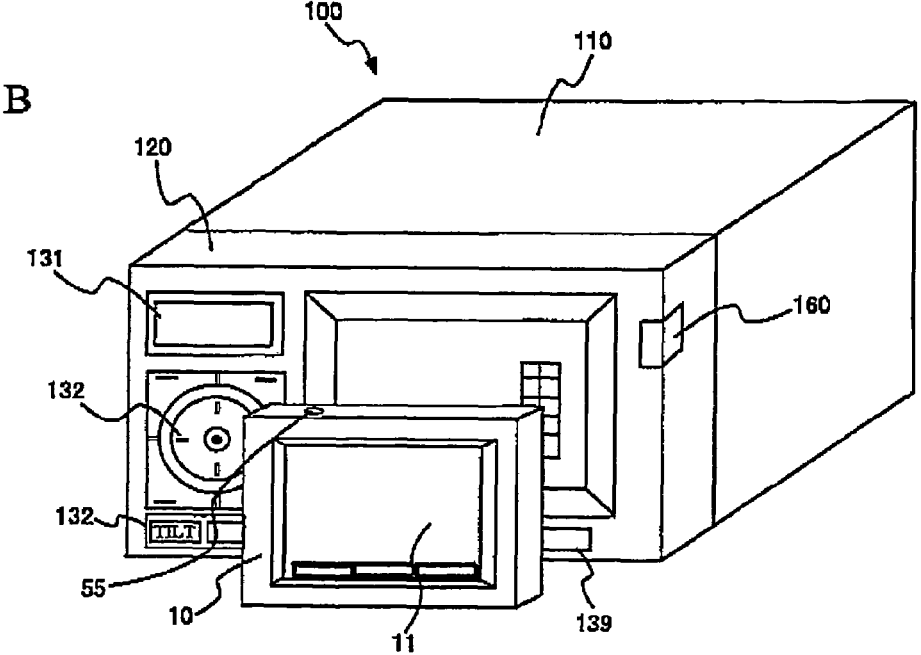

FIGS. 1A and 1B show the external appearance of a vehicle-mounted system 1 that is an example of an electronic system. As shown in FIGS. 1A and 1B, the vehicle-mounted system 1 includes a vehicle-mounted device 100 (an electronic device) that is mounted on a vehicle, and a portable device 10 (a portable electronic device) that has navigating functions. The portable device 10 can be attached to the front-face unit 120 (a cap unit) of the vehicle-mounted device 100 as shown in FIG. 1A, and can be detached from the vehicle-mounted device 100 as shown in FIG. 1B. The vehicle-mounted device 100 may be a vehicle-mounted audio device that reproduces music data, for example. The portable device 10 may be a portable navigator that has navigating functions, for example.

The vehicle-mounted device 100 is a device that can reproduce radio broadcasting, or a device that can reproduce music data written on a recording medium such as a CD (Compact Disc). The vehicle-mounted device 100 includes a vehicle-mounted main unit 110 (the main unit) that has a CD reproducing part and a CD insertion and ejection slit, and the front-face unit 120 that has a display unit 131 and an operating unit 132.

The portable device 10 has navigating functions, including the function of searching for a guide route to a destination and the function of displaying the guide route superimposed on a map.

Figure 2:
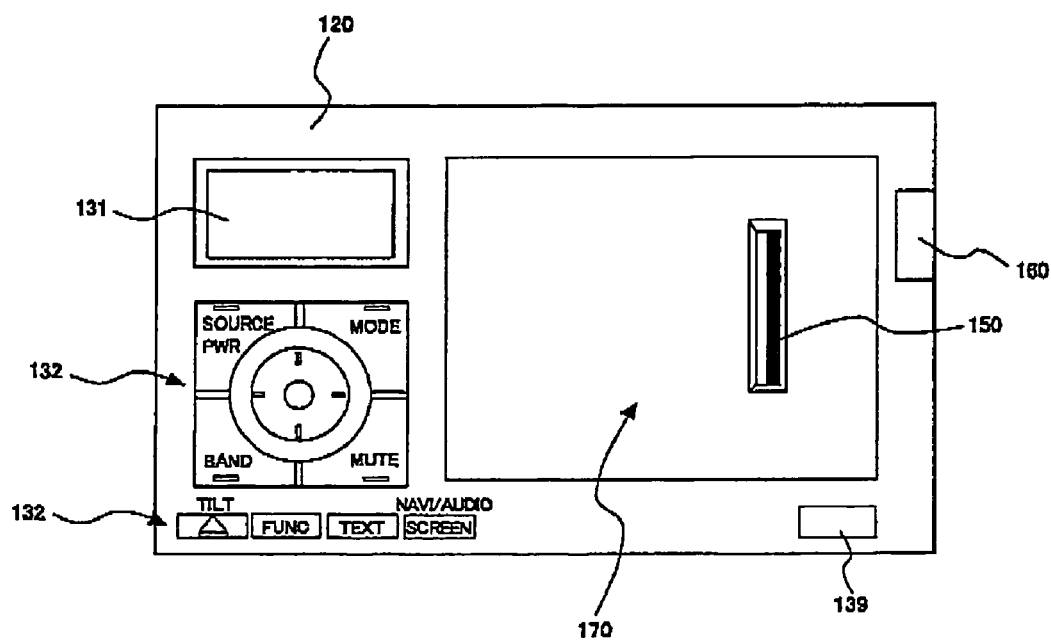
FIG. 2 shows a portable device detached from the vehicle-mounted device.

FIG. 2 shows the vehicle-mounted device 100 (the front-face unit 120), with the portable device 10 being detached from the vehicle-mounted device 100 (the front-face unit 120).

An attachment unit 170 that has a concave portion formed to accommodate the portable device 10 is provided on the front-face unit 120 of the vehicle-mounted device 100. This attachment unit 170 has a connector 150 for electrically connecting the vehicle-mounted device 100 and the portable device 10, and a lock mechanism (not shown) for fixing the portable device 10 to the front-face unit 120. When a detachment button 160 provided on the front-face unit 120 is pressed, the lock mechanism (not shown) is canceled, so that the portable device 10 can be detached from the vehicle-mounted device 100.

Figure 3:
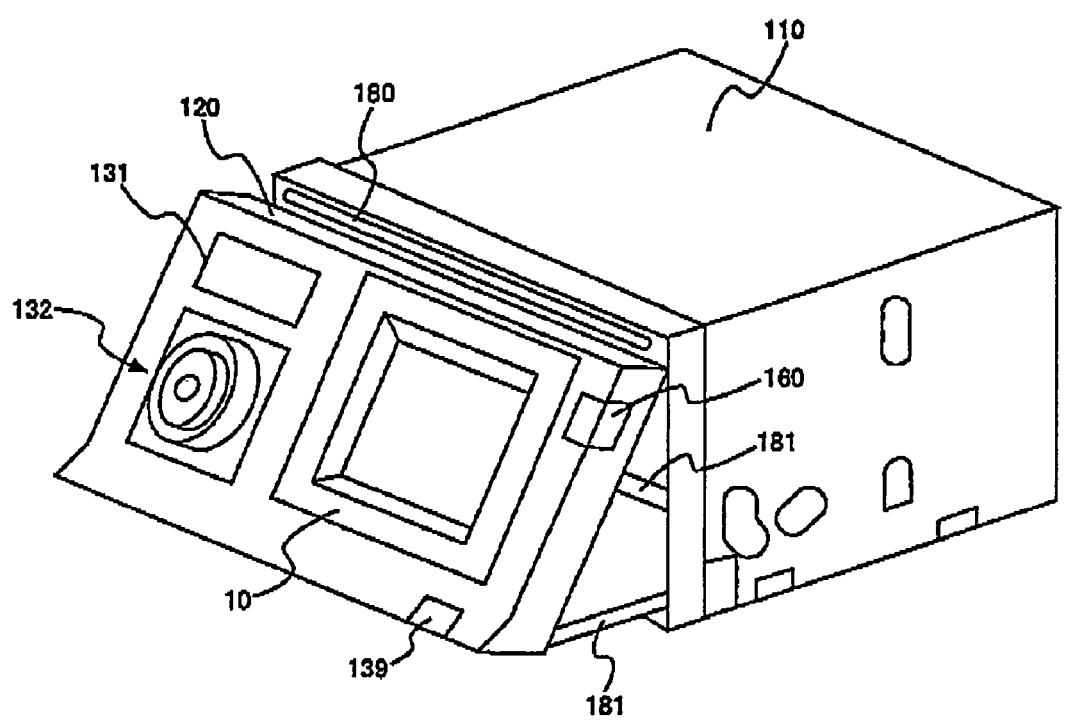
FIG. 3 shows a situation in which the front-face unit of the vehicle-mounted device is tilted with respect to the vehicle-mounted device main unit, and the CD insertion/ejection slit is exposed.

FIG. 3 shows a situation in which the front-face unit 120 is tilted with respect to the vehicle-mounted device main unit 110, so as to expose the CD insertion/ejection slit 180.

A slider 181 has one end connected to the lower portion of the front-face unit 120, and slides in the forward and backward directions of the vehicle-mounted device main unit 110, so as to push out and retract the lower portion of the front-face unit 120, with the upper portion of the front-face unit 120 being the supporting point. The slider 181 shown in FIG. 3 are driven in the forward and backward directions of the vehicle-mounted device main unit 110 by the driving mechanism shown in FIG. 9, so that the front-face unit 120 can be tilted with respect to the vehicle-mounted device main unit 110. Through the tilting action, the CD insertion/ejection slit 180 provided in the vehicle-mounted device main unit 110 is exposed, so that a CD can be inserted to and ejected from the device, and the display unit 131 of the vehicle-mounted device 100 and the display unit 11 of the portable device 10 can be adjusted for easier viewing and listening. An operation button (the tilt/eject button 132a shown in FIG. 6) is provided on the front-face unit 120 of the vehicle-mounted device 100, and a desired tilting angle can be set by handling this button.

Figure 4:
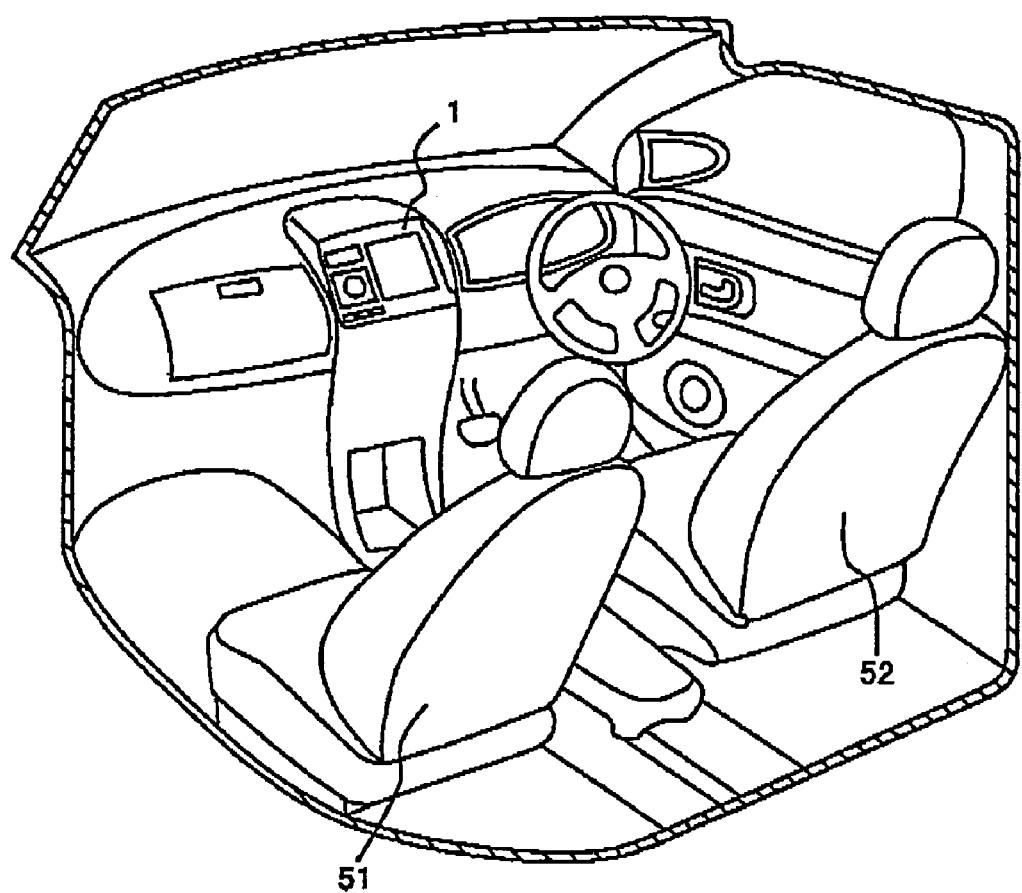
FIG. 4 shows an example case where the vehicle-mounted system is mounted on a vehicle.

FIG. 4 shows an example case where the vehicle-mounted system 1 is mounted in a vehicle.

As shown in FIG. 4, the vehicle-mounted system 1 may be provided in a dashboard area located substantially at the mid point between a driver seat 52 and a front passenger seat 51.

Although not shown in the drawing, the GPS antenna of a GPS information receiving unit 133 (described later) is provided on the dashboard or is attached to the inner face of the windshield.

Figure 5:
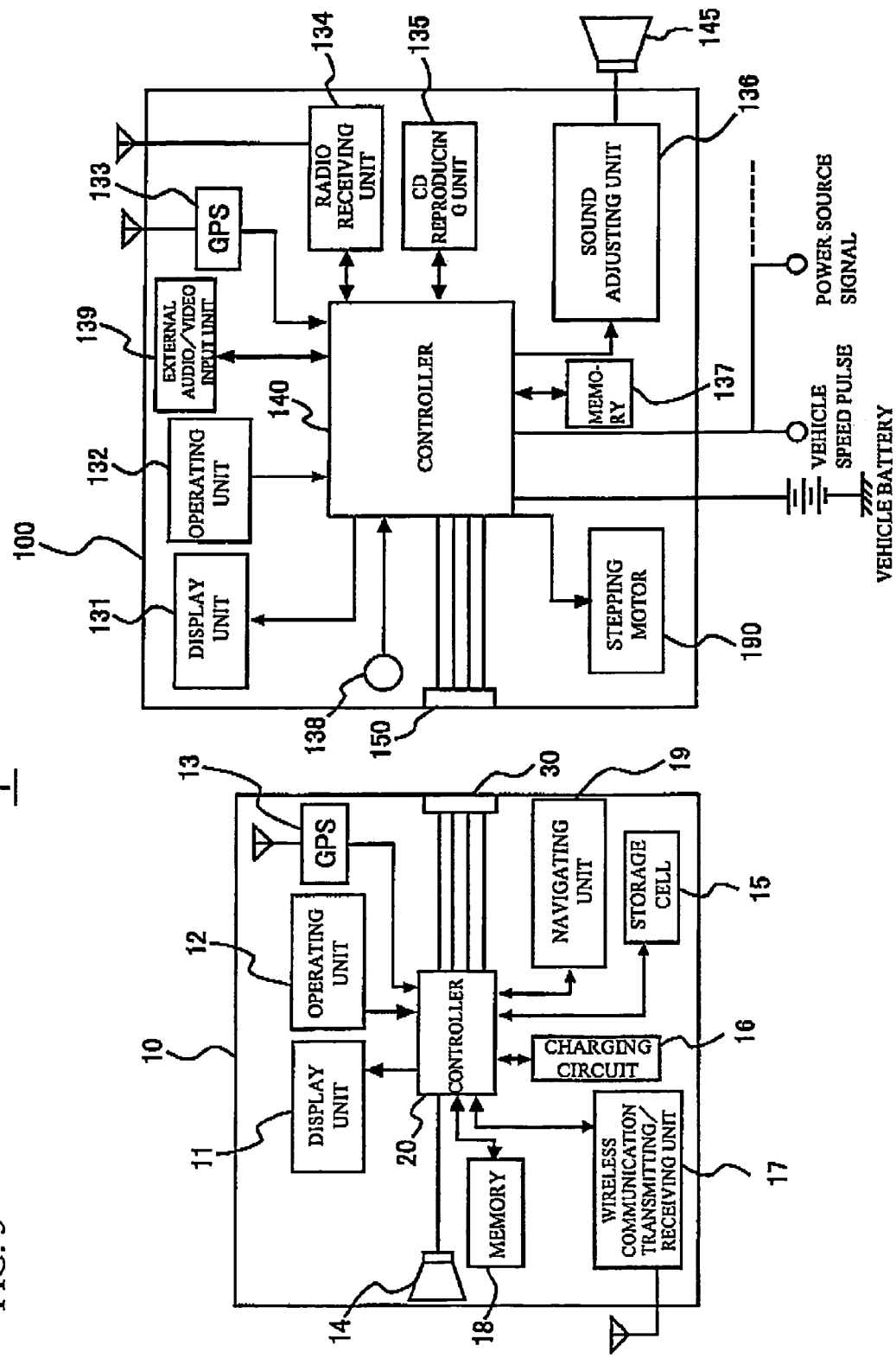
FIG. 5 is a block diagram schematically showing the structure of the vehicle-mounted system.

FIG. 5 is a block diagram schematically showing the structure of the vehicle-mounted system 1.

The vehicle-mounted device 100 and the portable device 10 are electrically connected to each other with connectors. The connector 150 is provided on the side of the vehicle-mounted device 100, and a connector 30 is provided on the portable device 10. Those connectors 150 and 30 are connected to each other, so that various signals are transmitted and received between the vehicle-mounted device 100 and the portable device 10, and the vehicle-mounted device 100 and the portable device 10 function as the vehicle-mounted system 1. Also, power supply terminals for supplying electric power from the battery of the vehicle to the portable device 10 are attached to the connectors 150 and 30. When the portable device 10 is connected to the vehicle-mounted device 100, and electric power is being supplied to the vehicle-mounted device 100, the electric power is also being supplied to the portable device 10 via the power supply terminal.

The vehicle-mounted device 100 includes the display unit 131, the operating unit 132, the GPS information receiving unit 133, a radio receiving unit 134, a CD reproducing unit 135, a sound adjusting unit 136, a memory 137, a microphone 138, an external audio/video input unit 139, a controller 140 (a controlling unit), the connector 150, and a stepping motor 190. When the engine key is located at Acc or ON position, electric power is supplied from the battery on the vehicle, and the vehicle-mounted device 100 is activated.

In the following, the functions of each component are described in detail.

The display unit 131 has a liquid crystal panel and a backlight, and displays the receiving broadcasting frequency, the reproduced tune track No., the reproduced tune title, and the likes, by the 13-segment display technique.

Figure 6:
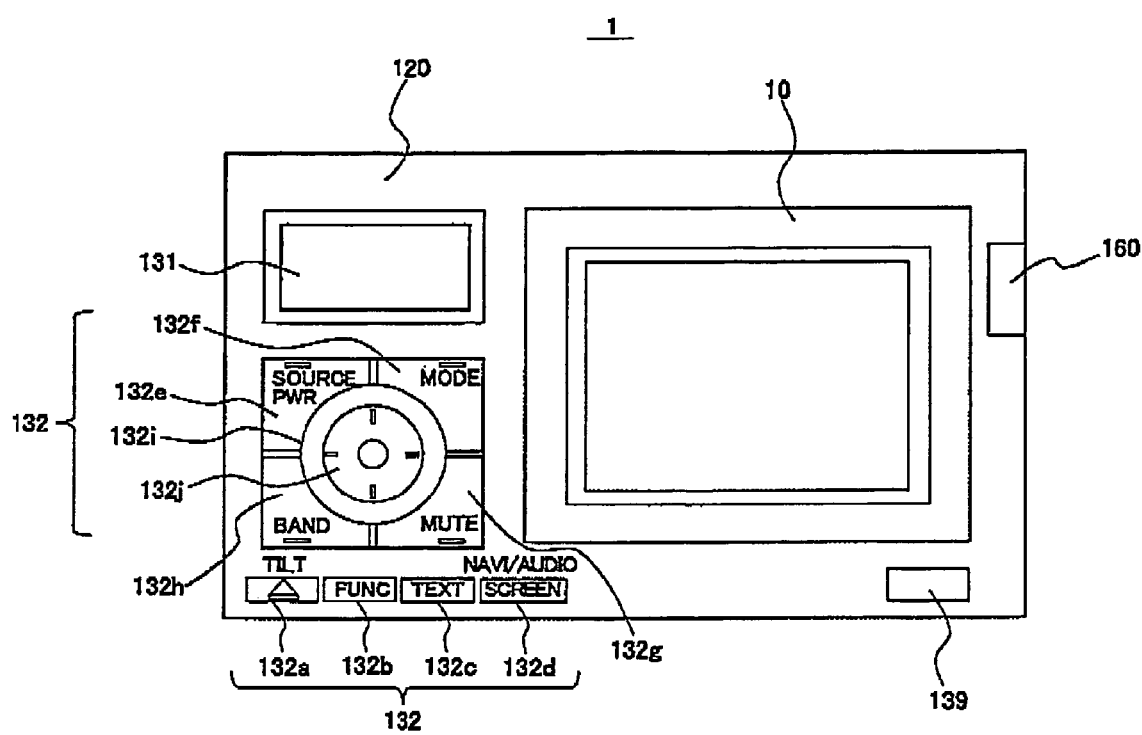
FIG. 6 shows an example of the front-face unit of the vehicle-mounted device.

The operating unit 132 is designed to perform the operation for switching operation modes of the vehicle-mounted device 100, and the operation in each selected mode. As shown in FIG. 6, the operating unit 132 has the group of buttons consisting of the tilt/eject button 132a, a function (hereinafter shown as FUNC)/AF button 132b, a TEXT button 132c, a SCREEN button 132d, a SOURCE/PWR button 132e, a MODE button 132f, a MUTE button 132g, a BAND switch button 132h, a rotary button 132i, and a cross-key/enter-key button 132j.

The control operations with the use of the group of buttons are now described.

First, the switching operation for switching displays of the portable device 10 and the vehicle-mounted device 100 with the use of the SOURCE/PWR button 132e is described.

The SOURCE/PWR button 132e of the vehicle-mounted device 100 is pressed, so as to switch on the vehicle-mounted device 100. While the vehicle-mounted device 100 is on, the SOURCE/PWR button 132e is pressed down for a very short time, so as to play a CD or change sources such as radio broadcasting. Here, the display unit 131 of the vehicle-mounted device 100 shows the information about the selected source, and the display unit 11 of the portable device 10 shows a navigation screen, regardless of which source is selected.

When the SCREEN button 132d is pressed down, the display on the display unit 11 of the portable device 10 is switched from the navigation screen to an image according to the source selected through the vehicle-mounted device 100.

Figure 7A:
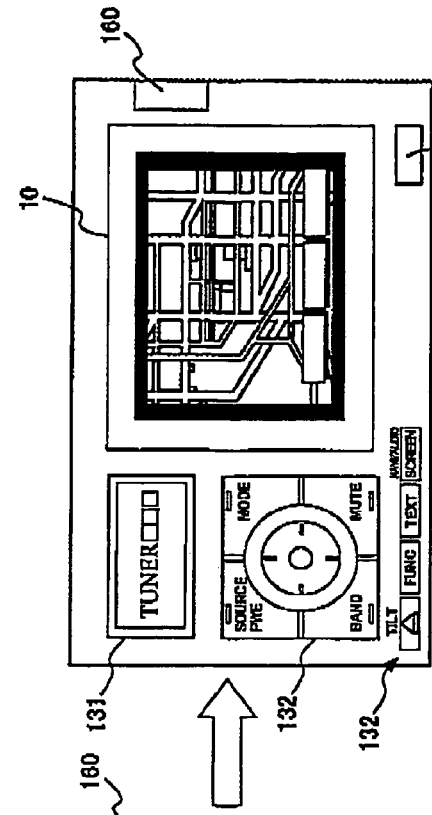
FIGS. 7A through 7D show the changes of the contents displayed on the display unit of the vehicle-mounted device and the display of the portable device.

FIG. 7A shows a situation in which the portable device 10 is attached to the vehicle-mounted device 100 while the vehicle-mounted device 100 is playing a CD, and the portable device 10 displays a navigation screen.

Figure 7B:
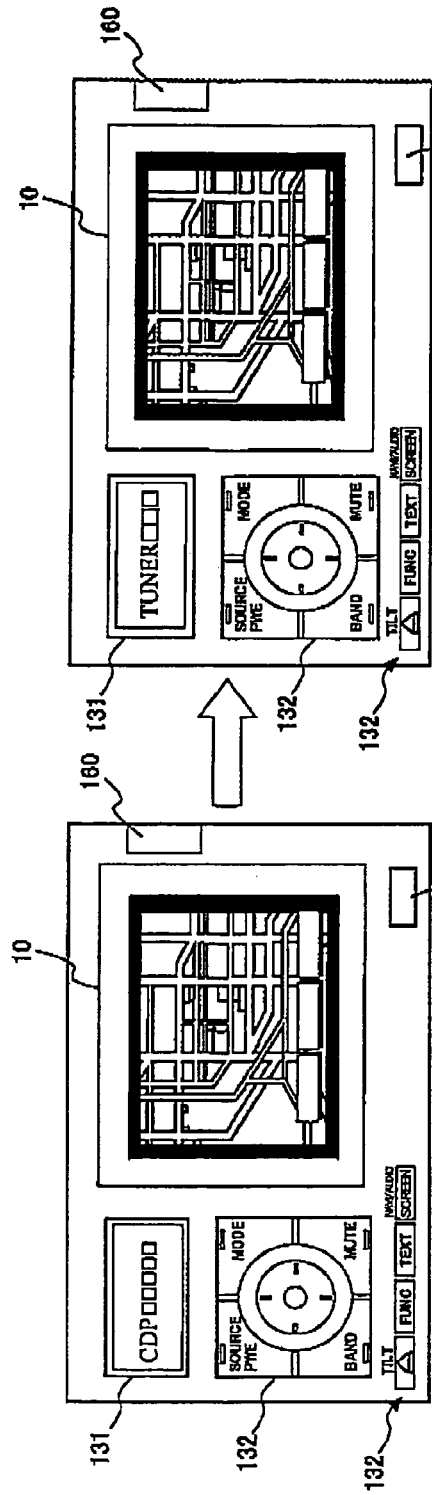

When the SOURCE/PWR button 132e is pressed down in the situation shown in FIG. 7A so as to change sources from the CD to radio broadcasting, the information about the radio source is displayed on the display unit 131, as shown in FIG. 7B. The display unit 11 of the portable device 10 keeps displaying the navigation screen.

Figure 7D:
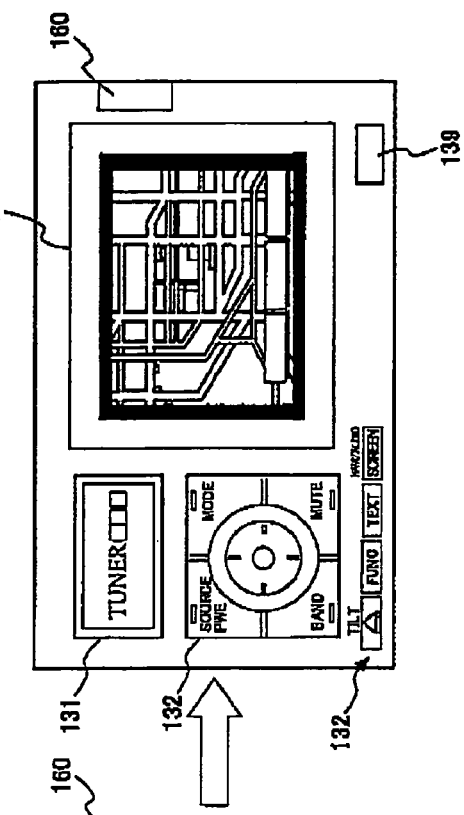
Figure 7C:
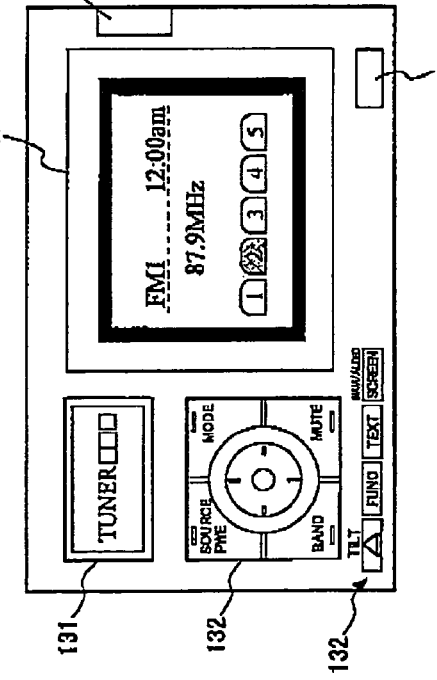

When the user presses the SCREEN button 132d, the display unit 11 of the portable device 10 displays an image according to the source that is being processed by the vehicle-mounted device 100 as shown in FIG. 7C (radio broadcasting information is shown in FIG. 7C). The display unit 11 of the portable device 10 has a touch panel (described later). The user selects one of the operation buttons displayed on the display unit 11 via the touch panel, so as to carry out the operation for the source that is being processed.

When the SCREEN button 132d is pressed while the radio image is displayed on the display unit 11, the display can be switched back from the radio image to the navigation screen, as shown in FIG. 7D. If the portable device 10 is detached from the vehicle-mounted device 100, the pressing of the SCREEN button 132d becomes invalid.

In a case where a USE (Universal Serial Bus) or the like is connected to the external audio/video input unit 139 while the portable device 10 is detached from the vehicle-mounted device 100, even if the SOURCE/PWR button 132e is pressed down, the display is not switched to the USE source.

The tilting action of the front-face unit 120 that is caused by handling the tilt/eject button 132a is now described.

When the tilt/eject button 132a is operated in the first mode ("short-time pressing mode", for example), the front-face unit 120 is tilted at such an angle as to expose the CD insertion/ejection slit 180. When the tilt/eject button 132a is operated in the second mode ("long-time pressing mode", for example), the front-face unit 120 is tilted at a predetermined angle each time.

Referring back to FIG. 5, the GPS information receiving unit 133 has a GPS antenna and a tuner unit, and receives GPS signals from satellites. Each GPS signal received by the GPS information receiving unit 133 is output to the navigating unit 19 of the portable device 10 via the controller 140, the connector 150, the connector 30, and a controller 20. Based on the GPS signal, the location of the vehicle on which the vehicle-mounted device 100 accommodating the portable device 10 is determined.

Alternatively, each GPS signal received by the GPS information receiving unit 133 may be output to the navigating unit 19 of the portable device 10 via the controller 20, without involving the controller 20. Also, the GPS information receiving unit 133 may be formed only with a GPS antenna, and each GPS signal received at the GPS antenna may be output to the tuner of a GPS information receiving unit 13 (described later), with the controller 140 and the controller 20 being not involved. Each GPS signal may also be output to the tuner of the GPS information receiving unit 13 via the controller 20, with the controller 140 being not involved. It is possible to make other modifications to the above arrangement.

The radio receiving unit 134 has an antenna and a tuner unit, and receives broadcast wave such as AM broadcast wave, FM broadcast wave, or multiple broadcast wave. The radio receiving unit 134 then outputs an audio signal, receives and demodulates multiple data, and outputs a demodulated signal to the controller 140.

The CD reproducing unit 135 reproduces the data recorded on a CD, and outputs a reproduction signal to the controller 140. Alternatively, the demodulated signal that is output from the radio receiving unit 134 may be output to the sound adjusting unit 136, with the controller 140 being not involved.

The sound adjusting unit 136 performs signal processing such as sound volume adjustment or sound quality adjustment on the sound that is received and demodulated by the radio receiving unit 134 or the audio signal that is reproduced by the CD reproducing unit 135. The sound adjusting unit 136 then outputs the processed signal to a speaker 145. The memory 137 can be formed with a RAM (Random Access Memory) on and from which data can be written and read. The information required for controlling operations, such as the tilting state of the front-face unit 120, is temporarily stored in the memory 137.

The microphone 138 is designed for communication in a handsfree fashion, and captures the voice of users in the vehicle. The external audio/video input unit 139 has a USB memory and a connection terminal for a connection to an external device such as a portable audio device. The external audio/video input unit 139 receives audio signals or data from an external device, and transmits the audio signals or data to the controller 140. The external audio/video input unit 139 also outputs control signals, audio signals, or data received from the controller 140 to a connected external device.

In accordance with an operation through the operating unit 132, the controller 140 controls the radio receiving unit 134, the CD reproducing unit 135, and the sound adjusting unit 136.

The controller 140 also outputs various signals to the portable device 10 via the connector 150. Based on various signals that are input from the portable device 10, the controller 140 controls the vehicle-mounted device 100. For example, the controller 140 outputs a GSP signal that is received through the GPS information receiving unit 133 or an audio signal that is input through the microphone 138 to the portable device 10 via the connector 150.

Alternatively, an audio signal that is input through the microphone 138 may be output to the portable device 10 via the connector 150, with the controller 140 being not involved.

The controller 140 also receives a speech voice, via the connector 150, from a portable telephone device connected to the portable device 10. The controller 140 then outputs the speech voice to the speaker 145 via the sound adjusting unit 136. The controller 140 further obtains an operation signal for the menu screen of each mode to be displayed on the display unit 11 of the portable device 10, and controls the radio receiving unit 134 and the CD reproducing unit 135.

Electric power is supplied to the controller 140 from the battery mounted on the vehicle. If the portable device 10 is connected to the vehicle-mounted device 100, the controller 140 outputs the electric power from the battery to the portable device 10. A vehicle-speed pulse and an illumination source signal are input from the vehicle to the controller 140. The controller 140 transfers the vehicle-speed pulse to the controller 20 of the portable device 10. Alternatively, the vehicle-speed pulse may not be input to the controller 140 in the first place.

The stepping motor 190 is used to push the slider 181 shown in FIG. 3 out of the vehicle-mounted device 100, or to retract the slider 181 to the vehicle-mounted device 100. By inputting a pulse signal to the stepping motor 190, the controller 140 controls the rotation angle of a gear (not shown) attached to the stepping motor 190.

Figure 8:
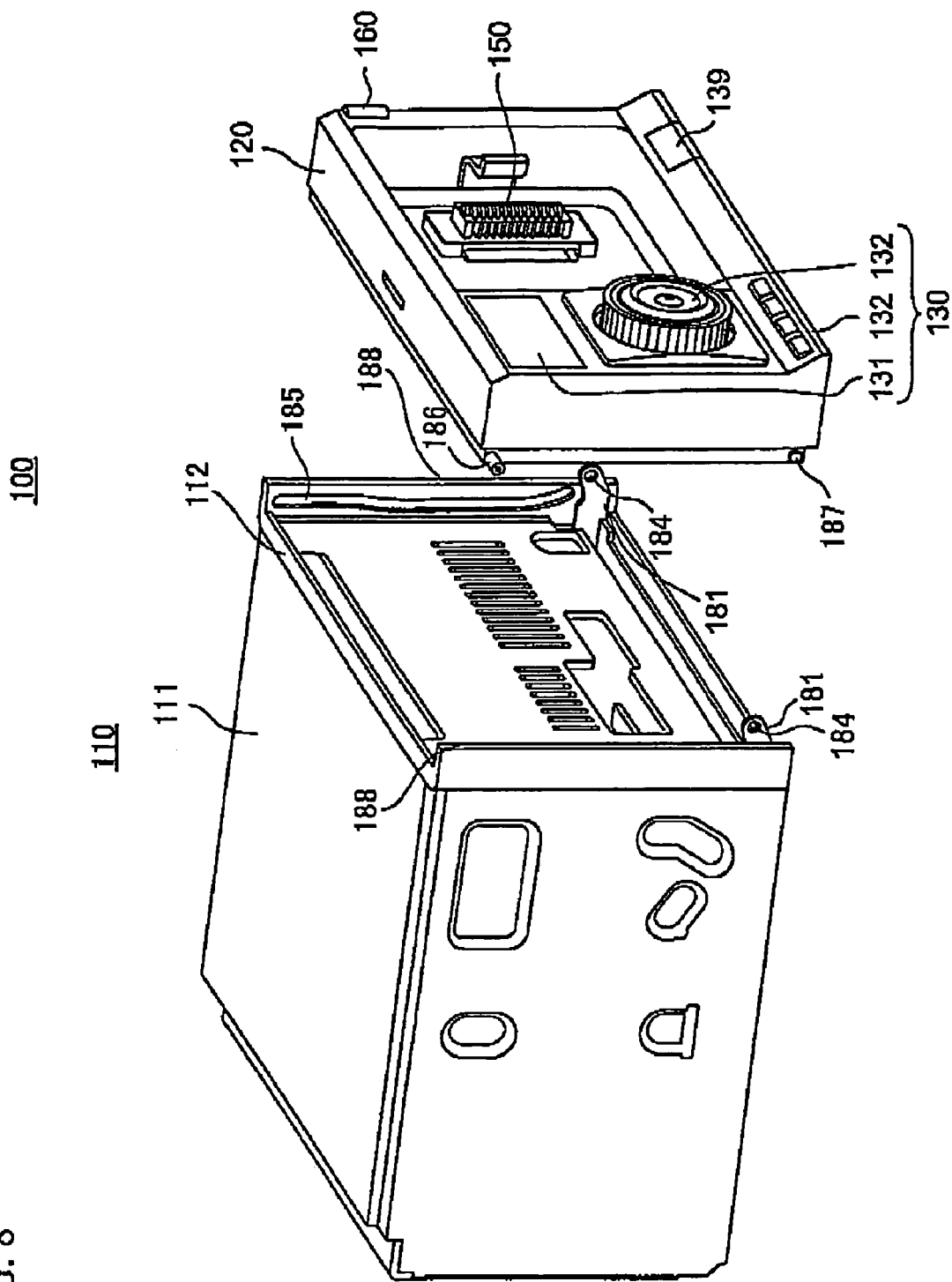
FIG. 8 shows the engaging relationship between the vehicle-mounted device main unit and the front-face unit.

FIG. 8 shows the engaging relationship between the vehicle-mounted device main unit 110 and the front-face unit 120.

The vehicle-mounted device main unit 110 is formed with a main frame 111 and a front-face panel 112. The front-face panel 112 has slide grooves formed in both inner side faces 188. The slide grooves are designed for engaging pins 186 to slide freely. The engaging pins 186 are provided at the upper portions of the left and right side faces of the front-face unit 120. Screw holes 184 formed in the slider 181 are fixed with screws (not shown) to screw holes 187 formed at the lower portions of the left and right side faces of the front-face unit 120.

Figure 9:
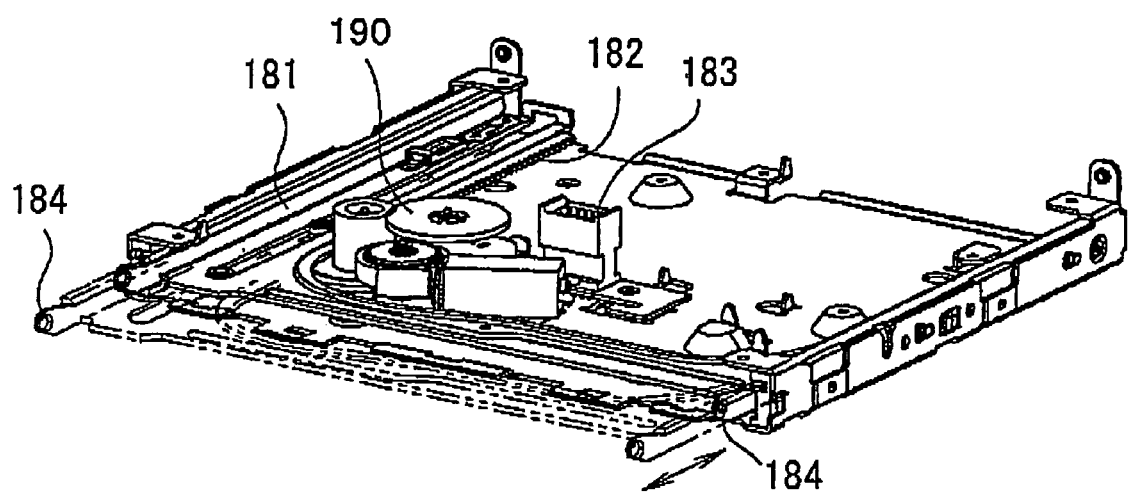
FIG. 9 shows the stepping motor and the slider provided at the bottom portion in the vehicle-mounted device.

FIG. 9 shows the stepping motor 190 and the slider 181 provided at the bottom portion in the vehicle-mounted device 100.

The stepping motor 190, the slider 181 having a rectangular shape minus one side, and a connector 183 for connecting with the substrate (not shown) having the controller 140 mounted thereon are provided at the bottom portion inside the vehicle-mounted device 100. The slider 181 has sawing teeth 182. The sawing teeth 182 are to be engaged with the gear (not shown) of the stepping motor 190. Accordingly, when the gear of the stepping motor 190 revolves, the slider 181 moves back and forth in the depth direction of the vehicle-mounted device main unit 110. With this action, the lower portion of the front-face unit 120 moves back and forth in the depth direction of the vehicle-mounted device main unit 110, and the engaging pins 186 of the front-face unit 120 slides along the slide grooves 185, so as to cause the front-face unit 120 to tilt with respect to the vehicle-mounted device main unit 110. The virtual line shown in FIG. 9 indicates the location of the slider 181 when the slider 181 is pushed out of the vehicle-mounted device main unit 110.

The stepping motor 190 and the slider 181 are equivalent to the driving unit in the claims.

The portable device 10 is now described. The portable device 10 includes the display unit 11, the operating unit 12, the GPS information receiving unit 13, the speaker 14, a storage cell 15, a cell charging circuit 16, a wireless communication transmitting/receiving unit 17, a memory 18, the navigating unit 19, the controller 20, and the connector 30.

The functions of each of the components are now described in detail.

The display unit 11 includes a liquid crystal panel and a backlight. The display unit 11 can display map information or destination guide route information that is generated by the navigating unit 19, or the received broadcasting frequency, the reproduced tune track No., the reproduced tune title, or the like that is transferred from the vehicle-mounted device 100. Each of the display units 11 and 131 may not be formed with a liquid crystal panel, but may be formed with another flat panel display such as an organic EL display panel, a plasma display panel, or a cold-cathode flat display panel.

The operating unit 12 includes a touch panel and a power switch button 55 (see FIG. 10A) for switching on and off the power source of the portable device 10. The touch panel may be placed on the display screen of the display unit 11, for example. When the touch panel is touched with a finger or a special-purpose pen, the touched point is spotted, and an input operation is detected. The power switch button 55 will be described later.

The GPS information receiving unit 13 includes an antenna and a tuner unit, and receives GPS signals from satellites. Each received GPS signal is output to the navigating unit 19, and the location of the device is determined from the GPS signal. The vehicle-mounted device 100 also has the GPS information receiving unit 133 mounted thereon. When the portable device 10 is attached to the vehicle-mounted device 100, the location of the vehicle on which the vehicle-mounted device 100 accommodating the portable device 10 is mounted is determined from a GPS signal (and a vehicle speed pulse) received by the GPS information receiving unit 133. When the portable device 10 is used independently of the vehicle-mounted device 100, the location of the portable device 10 is determined from a GPS signal received by the GPS information receiving unit 13.

The speaker 14 is designed to output audio information that is supplied from the navigating unit 19. When the portable device 10 is detached from the vehicle-mounted device 100 or is used independently of the vehicle-mounted device 100, the speaker 14 outputs audio information.

The storage cell 15 supplies electric power to each component of the portable device 10. When the portable device 10 is attached to the vehicle-mounted device 100, electric power is supplied from the battery of the vehicle via the power supply terminal of the connector 30, and the storage cell 15 is charged by the charging circuit 16. The charging circuit 16 receives electric power from a connected terminal via a USB slot (see FIG. 10A), and then charges the storage cell 15.

The wireless communication transmitting/receiving unit 17 exchanges communication voices with a portable telephone, and obtains information to be used for navigations via a portable telephone. The wireless communication transmitting/receiving unit 17 may utilize Bluetooth, which is a 2.4-GHz band wireless transmission method.

The memory 18 may be a RAM on which reading and writing can be performed. Information that is read for each controlling operation is temporarily stored in the memory 18.

The navigating unit 19 includes a map information storage unit that obtains and stores map information supplied from a SD card or a USB memory (described later) that stores the map information to be used for navigations. In accordance with a GPS signal supplied from the GPS information receiving unit 133 or 13, the navigating unit 19 detects the current location information, and creates an image to be used in a navigating operation. The created map can be displayed on the display unit 11. When the portable device 10 is connected to the vehicle-mounted device 100, the vehicle speed pulse is obtained from the vehicle, so as to increase the accuracy of determining the location of the vehicle on which the vehicle-mounted device 100 accommodating the portable device 10 is mounted. Alternatively, the map information may be stored in the portable device 10.

The controller 20 controls each of the components of the portable device 10. The controller 20 also outputs various signals to the vehicle-mounted device 100 via the connector 30, and, based on various signals that are input from the vehicle-mounted device 100, controls the portable device 10. For example, the controller 20 obtains a GPS signal and a vehicle speed pulse received by the GPS information receiving unit 133 of the vehicle-mounted device 100, from the controller 140 of the vehicle-mounted device 100. The controller 20 then outputs the GPS signal and the vehicle speed pulse to the navigating unit 19.

The controller 20 also obtains an audio signal that is input through the microphone 138 of the vehicle-mounted device 100, from the controller 140 of the vehicle-mounted device 100. In accordance with the audio signal, the controller 20 controls the navigating unit 19. Accordingly, the navigating unit 19 can be operated in a handsfree fashion. The controller 20 also outputs communication voices from a portable telephone connected to the wireless communication transmitting/receiving unit 17, to the vehicle-mounted device 100 via the connector 30, so that the communication voices can be output from the speaker 145 of the vehicle-mounted device 100. The controller 20 also outputs an operation signal for a menu screen or a content screen displayed on the display unit 11, to the controller 140 of the vehicle-mounted device 100 via the connector 30. In accordance with the operation signal transmitted from the controller 20 of the portable device 10, the controller 140 controls the radio receiving unit 134 and the CD reproducing unit 135.

Figure 10A:
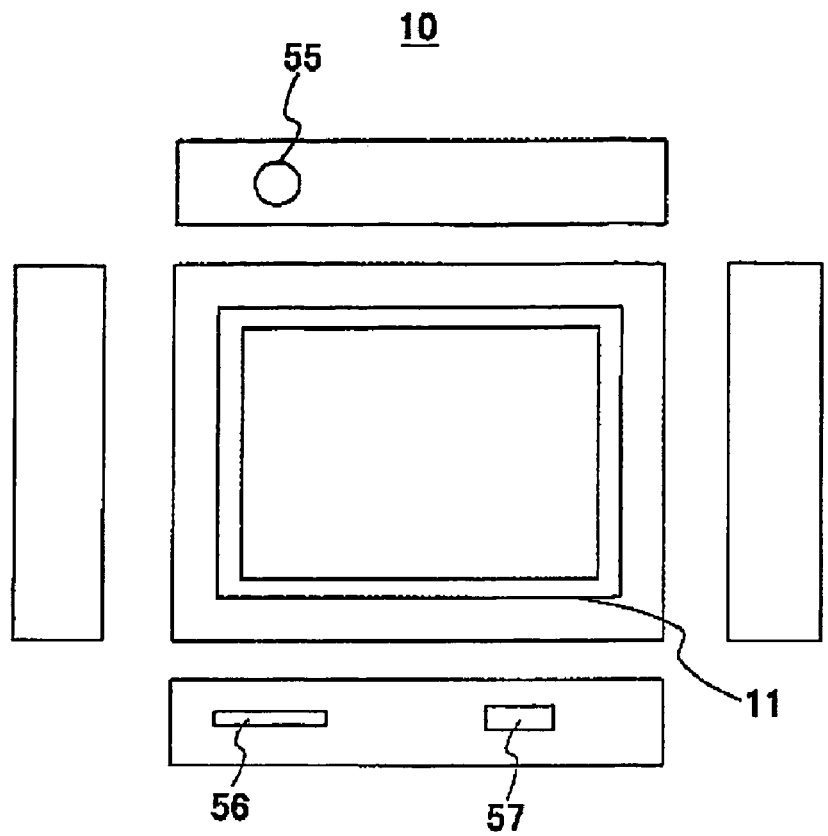
FIG. 10A shows a front view, a top view, a bottom view, a left side view, and a right side view of the portable device.
Figure 10B:
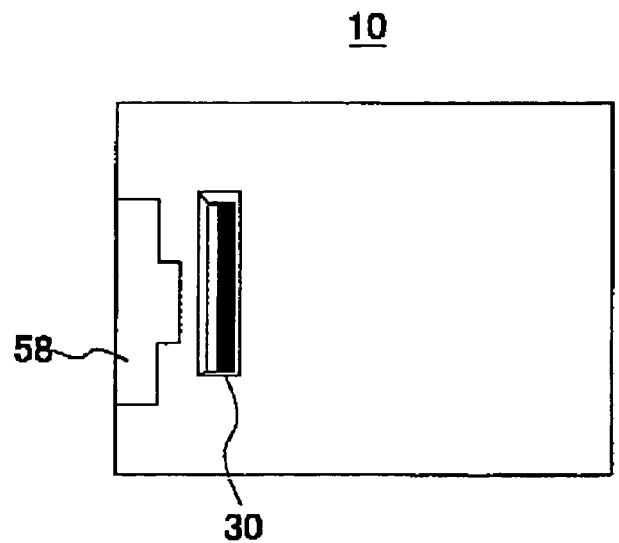
FIG. 10B is a back view of the portable device.

FIG. 10A shows a front view, a top view, a bottom view, a left side view, and a right side view of the portable device 10. FIG. 10B shows a back view of the portable device 10.

The power switch button 55 for switching on and off the power source of the portable device 10 is provided on the top face of the portable device 10. A SD (Secure Digital) memory card slot 56 and a USE slot 57 are formed in the bottom face of the portable device 10. A SD card or a USB memory having map information recorded thereon is inserted to the respective slots, so that the controller 20 can read the map information from the SD card or the USB memory, and output the map information to the navigating unit 19.

When the portable device 10 is attached to the vehicle-mounted device 100, the power source of the portable device 10 is switched on and off under the control of the vehicle-mounted device 100. When the portable device 10 is detached from the vehicle-mounted device 100 and is used independently, the power source is operated through ON and OFF operations of the power switch button 55.

The connector 30 for establishing an electric connection with the vehicle-mounted device 100, and an engaging portion 58 to be engaged with the lock mechanism (not shown) of the vehicle-mounted device 100 are provided on the back face of the portable device 10.

Figure 11:
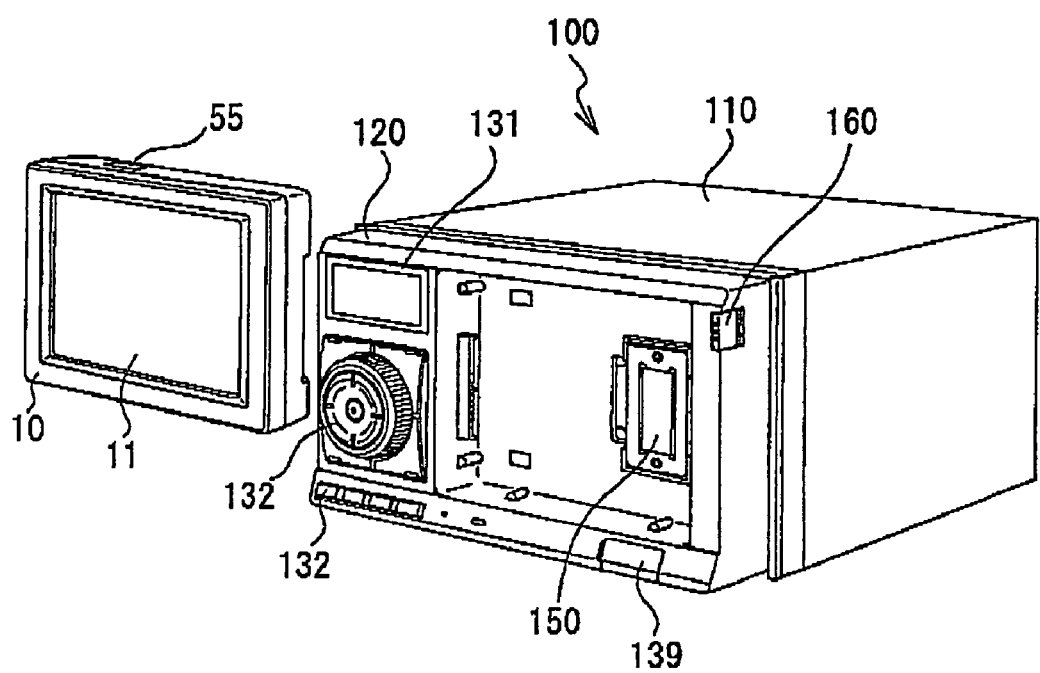
FIG. 11 illustrates a situation in which the portable device is detached from the vehicle-mounted device.

FIG. 11 is an actual external view equivalent to the schematic external view of the vehicle-mounted device 100 and the portable device 10 shown in FIG. 1A. The same components as those shown in FIG. 1B are denoted by the same reference numerals as those in FIG. 1B, and explanation of them is omitted here.

Figures 12A, 12B, 12C, 12D, 12E:
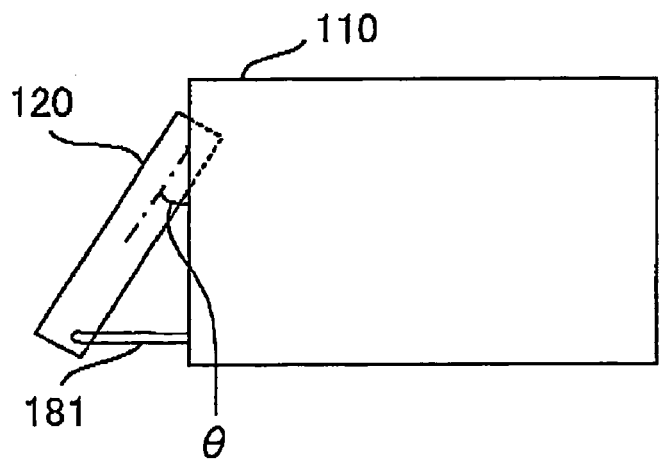
FIG. 12A shows the relationship between the tilt angle at the time of tilt driving and the number of pulses that are output to the stepping motor.
FIG. 12B shows the relationship between the tilt angle in a closed state and the number of pulses output to the stepping motor.
FIG. 12C shows the relationship between the tilt angle in the reference position and the number of pulses output to the stepping motor.
FIG. 12D is a schematic side view of the vehicle-mounted device.
FIG. 12E shows the current state of the front-face unit.

FIGS. 12A, 12B, and 12C show an example of table information that is stored in the memory 137 of the vehicle-mounted device 100. FIG. 12D is a schematic side view of the vehicle-mounted system 1. FIG. 12E shows the information about the state of the front-face unit 120 that is stored in the memory 137 of the vehicle-mounted device 100.

The information shown in FIGS. 12A, 12B, 12C, and 12E may not be recorded on the memory 137, but may be stored in or recorded on a memory provided inside the controller 140.

The table information shown in FIG. 12A indicates the relationship among the number of times the tilt/eject button 132*a* (see FIG. 6) is pressed in the second mode (a tilt instruction: long pressing, for example), the tilt angle θ (see FIG. 12D) indicating the tilting of the front-face unit 120 with respect to the vehicle-mounted device main unit 110, and the number of pulses of the pulse signal that is output from the controller 140 to the stepping motor 190.

As indicated in the table information shown in FIG. 12A, every time the tilt/eject button 132*a* is pressed in the second mode, the controller 140 outputs a pulse signal having ten pulses to the stepping motor 190, so that the tilt angle θ increases by 5 degrees. A pulse signal has one pulse indicating a one-time ON operation and a one-time OFF operation (one cycle in total), and the tilt angle θ increases by 0.5 degrees with one pulse.

If the tilt/eject button 132*a* is pressed seven times in the second mode, the front-face unit 120 returns to the initial position (0°). In that case, the record next to the number of pressing times "6" in the table information shown in FIG. 12A is a record of the number of pressing times "0".

More specifically, if the tilt/eject button 132*a* is pressed once after the tilt/eject button 132*a* is pressed six times in the second mode and the tilt angle of the front-face unit 120 is adjusted, a pulse signal of a different polar character from that of the pulse signal that increases the above described tilt angle θ is output from the controller 140 to the stepping motor. 190, and the front-face unit 120 is displaced in such a direction as to reduce the tilt angle θ.

The maximum tilt angle (indicated by the record of the number of pressing times "6") obtained through operations of the tilt/eject button 132*a* in the second mode should preferably be such an angle as not to expose the CD insertion/ejection slit 180.

It should be noted that the tilt angles and the number of records are not limited to the numeric values shown in the table.

The table information shown in FIG. 12B indicates the relationship between the tilt angle (see FIG. 12D) representing the tilting of the front-face unit 120 with respect to the vehicle-mounted device main unit 110 when the front-face unit 120 is in an open state, and the number of pulses in the pulse signal that is output from the controller 140 to the stepping motor 190.

The tilt angle of the front-face unit 120 in an open state is not limited to the numeric value shown in this table, and should be such an angle as to expose the CD insertion/ejection slit 180. Also, the tilt angle of the front-face unit 120 in an open state may be such an angle that the front-face unit 120 is laid completely flat.

The table information shown in FIG. 12C indicates the relationship between the tilt angle (see FIG. 12D) representing the tilting of the front-face unit 120 with respect to the vehicle-mounted device main unit 110 when the front-face unit 120 is in the reference position, and the number of pulses in the pulse signal that is output from the controller 140 to the stepping motor 190.

As indicated in the table information shown in FIG. 12C, when the front-face unit 120 is in the reference position, the tilt angle of the front-face unit 120 with respect to the vehicle-mounted device main unit 110 is 0°.

As shown in FIG. 12E, the memory 137 stores the current tilt angle θ and the open/close state of the front-face unit 120, or stores and updates the current tilt angle θ as the tilt angle θ of the front-face unit 120 adjusted by pressing the tilt/eject button 132a in the second mode, and the open/close state of the front-face unit 120 displaced by pressing the tilt/eject button 132a in the first mode.

Figure 13A:
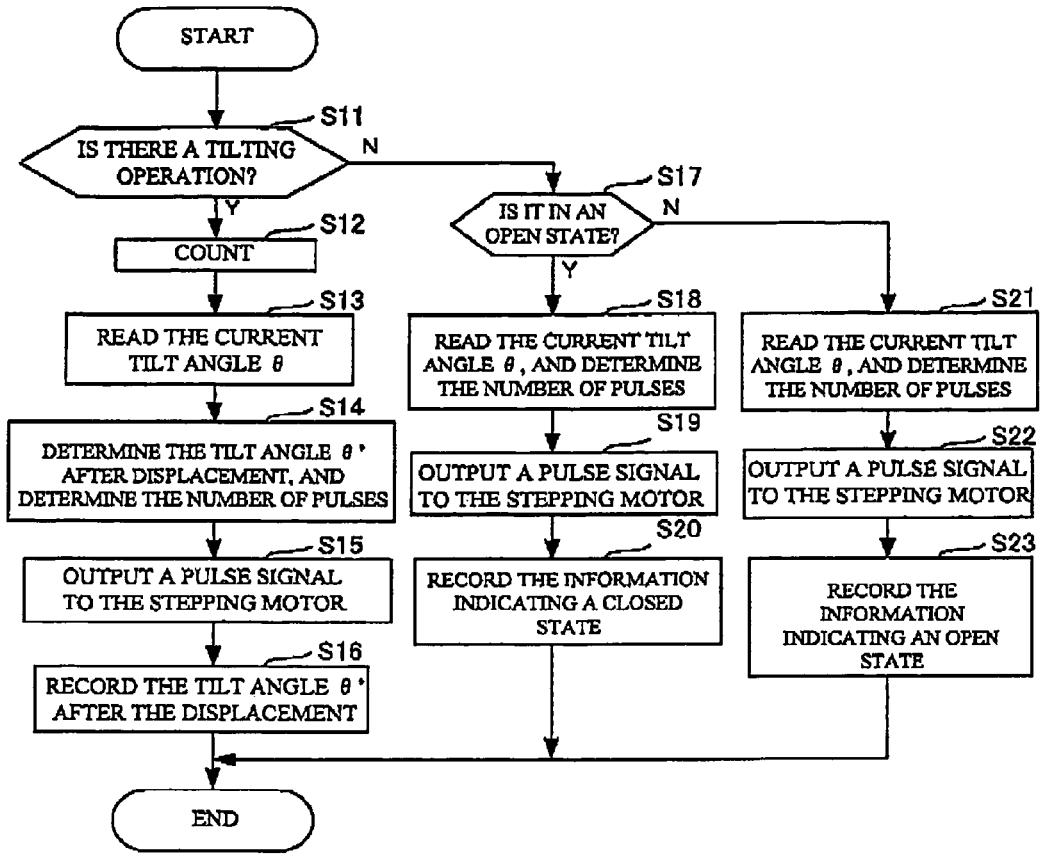
FIG. 13A is a flowchart showing a controlling operation to be performed by the controller of the vehicle-mounted device when the tilt/eject button is handled.
Figure 13B:
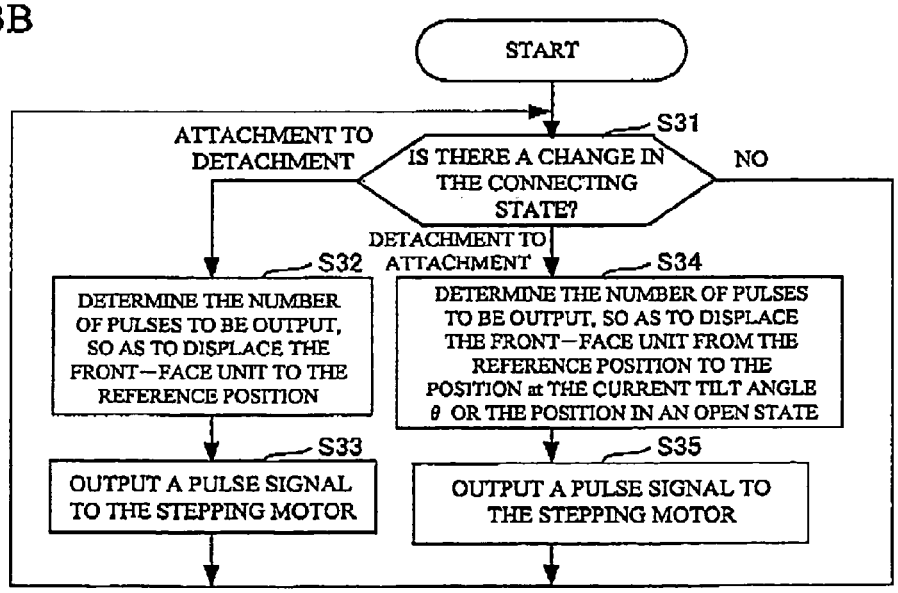
FIG. 13B is a flowchart showing a controlling operation to be performed by the controller of the vehicle-mounted device when there is a change in the connecting state of the portable device to the vehicle-mounted device.
Figure 14:
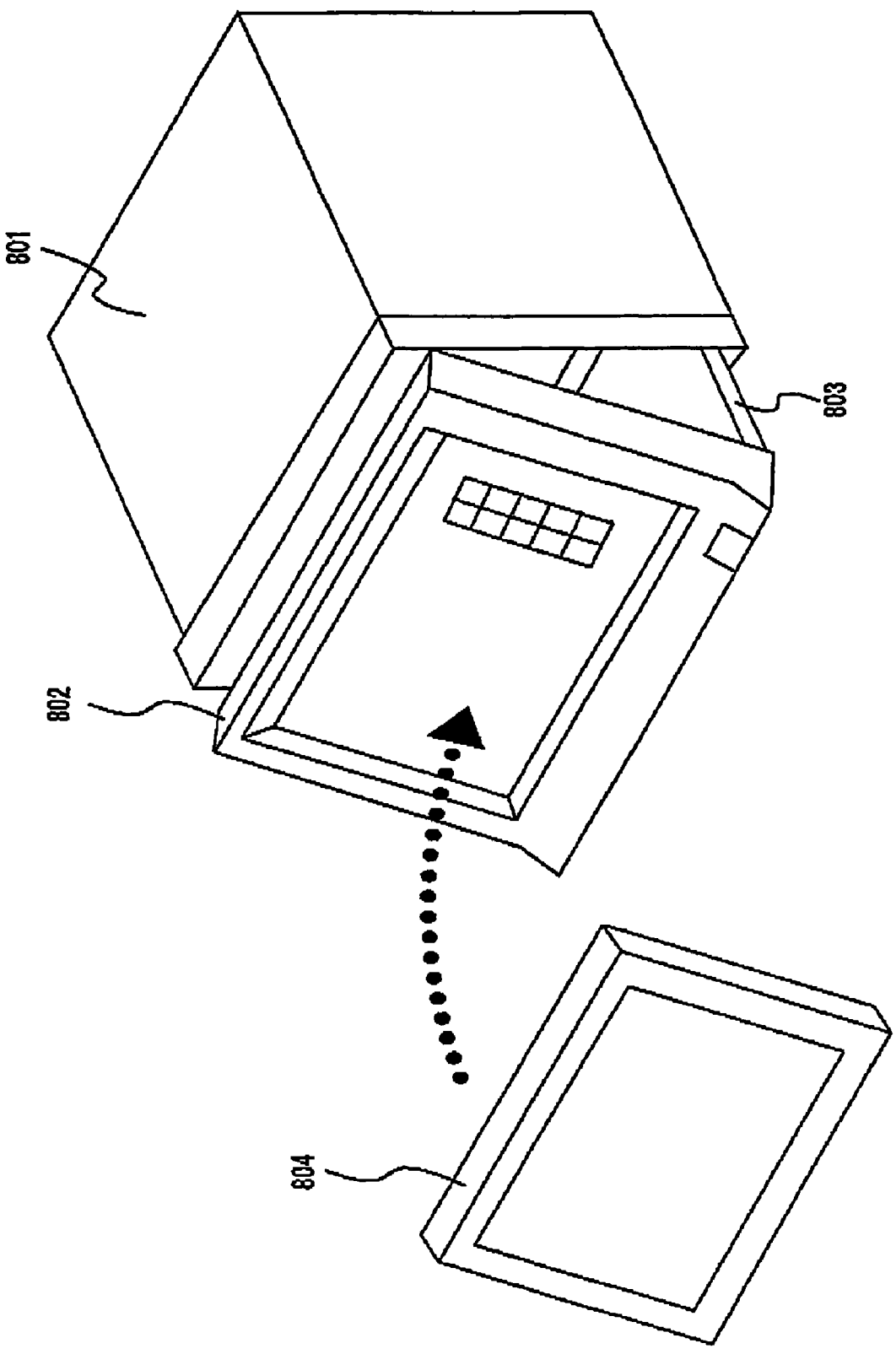
FIG. 14 is an external view of a conventional vehicle-mounted system.

FIG. 13A is a flowchart showing a controlling operation to be performed by the controller 140 of the vehicle-mounted device 100 when the tilt/eject button 132a. FIG. 13B is a flowchart showing a controlling operation to be performed by the controller 140 of the vehicle-mounted device 100 when the connecting state of the portable device 10 with respect to the vehicle-mounted device 100 is changed.

As described above, the memory 137 stores the current tilt angle θ as the tilt angle θ of the front-face unit 120 adjusted by pressing the tilt/eject button 132a in the second mode, and the open/close state of the front-face unit 120 displaced by pressing the tilt/eject button 132a in the first mode.

Referring first to FIG. 13A, the controlling operation to be performed by the controller 140 when the tilt/eject button 132a is handled is described. This controlling operation is to be performed when the controller 140 detects a user pressing the tilt/eject button 132a.

First, the controller 140 determines whether the operating mode of the tilt/eject button 132a is the second mode (a tilt instruction) or the first mode (an open/close instruction) (step S11).

If the controller 140 determines in step S11 that the pressing of the tilt/eject button 132a by a user is to issue a tilt instruction (the second mode: long pressing (for 1.7 seconds or longer, for example)), the controller 140 counts the number of times the tilt/eject button 132a is pressed in the second mode (the tilt instruction) (step S12). The controller 140 then reads the current tilt angle θ from the memory 137 (the table information shown in FIG. 12E) (step S13).

As described above, the memory 137 stores the current tilt angle θ as the tilt angle θ of the front-face unit 120 displaced by pressing the tilt/eject button 132a is handled in the second mode (a tilt instruction), as shown in FIG. 12E.

Instead of the current tilt angle θ, the information about the current tilt angle θ may be stored in the memory 137.

Based on the current tilt angle θ read from the memory 137 in step S13, the number of pressing times of the tilt/eject button 132a counted in step S12, and the table information shown in FIG. 12A stored in the memory 137, the controller 140 determines the tilt angle θ' of the post-displacement, and also determines the number of pulses to be output to the stepping motor 190 in accordance with the current tilt angle θ and the tilt angle θ' of the post-displacement (step S14).

To cause the front-face unit 120 to tilt at the tilt angle θ' of the post-displacement, the controller 140 outputs a pulse signal having the pulses determined in step S14 to the stepping motor 190 (step S15). The stepping motor 190 then drives the slider 181 by an amount equivalent to the number of pulses in the pulse signal supplied from the controller 140. Accordingly, the front-face unit 120 is displaced at the predetermined tilt angle θ'. The controller 140 updates and stores the tilt angle θ' as the current tilt angle θ in the memory 137 (the table information shown in FIG. 12E) (step S16), and ends this operation.

As described above, based on the number of times the tilt/eject button 132a is pressed for a tilt instruction (the second mode) and the table information shown in FIG. 12A, the front-face unit 120 can be displaced (can tilt) with respect to the vehicle-mounted device main unit 110.

If the controller 140 determines in step S11 that the pressing of the tilt/eject button 132a by the user is in the first mode (an open/close instruction: short pressing (for less than 1.7 seconds, for example)), the controller 140 determines whether the front-face unit 120 is in an open state, based on the information stored in the memory 137 (the table information shown in FIG. 12E) (step S17).

As shown in FIG. 12E, the memory 137 stores the information indicating that the front-face unit 120 is in an open state or a closed state, and also stores the initial value (the information indicating a closed state if an eject instruction through the tilt/eject button 132a has not been made in the past).

If the controller 140 determines in step S17 that the front-face unit 120 is in an open state, the pressing is to issue an instruction to displace the front-face unit 120 from an open state to a closed state. Therefore, the controller 140 reads the current tilt angle θ (the tilt angle observed before the front-face unit 120 is put into an open state) from the memory 137 (the table information shown in FIG. 12E), and determines the number of pulses to be output to the stepping motor 190 so as to put the front-face unit 120 back into the state observed before the front-face unit 120 is put into an open state (at the current tilt angle θ), based on the read current tilt angle θ and the table information stored in the memory 137 and shown in FIGS. 12A and 12B (step S18).

To cause the front-face unit 120 to tilt at the current tilt angle θ (the tilt angle observed before the front-face unit 120 is put into an open state), the controller 140 outputs a pulse signal having the pulses determined in step S18 to the stepping motor 190 (step S19). The stepping motor 190 then drives the slider 181 by an amount equivalent to the number of pulses in the pulse signal supplied from the controller 140. Accordingly, the front-face unit 120 is displaced at the current tilt angle θ (the tilt angle observed before the front-face unit 120 is put into an open state). The controller 140 then updates and stores the information indicating that the front-face unit 120 is in a closed state in the memory 137 (the table information shown in FIG. 12E) (step S20), and then ends the operation.

If the controller 140 determines in step S17 that the front-face unit 120 is not in an open state, the pressing is to issue an instruction to displace the front-face unit 120 from a closed state to an open state. Therefore, the controller 140 reads the current tilt angle θ from the memory 137 (the table information shown in FIG. 12E), and determines the number of pulses to be output to the stepping motor 190 so as to put the front-face unit 120 into an open state, based on the read-current tilt angle θ and the table information stored in the memory 137 and shown in FIGS. 12A and 12B (step S21).

To put the front-face unit 120 into an open state, the controller 140 outputs a pulse signal having the pulses determined in step S21 to the stepping motor 190 (step S22). The stepping motor 190 then drives the slider 181 by an amount equivalent to the number of pulses in the pulse signal supplied from the controller 140. Accordingly, the front-face unit 120 is displaced into an open state. The controller 140 then updates and stores the information indicating that the front-face unit 120 is in an open state in the memory 137 (the table information shown in FIG. 12E) (step S23), and ends the operation.

As described above, based on the number of times the tilt/eject button 132a is pressed for an open/close instruction (the first mode) and the table information shown in FIGS. 12A and 12B, the front-face unit 120 can be displaced (can tilt) with respect to the vehicle-mounted device main unit 110.

The table information shown in FIG. 12B may not be stored in the memory 137, but a detecting unit (such as a limit switch) for detecting such a state (an open state) as to expose the CD insertion/ejection slit 180 based on the amount of movement of the slider 181 or the like may be provided instead. In such a case, the detection results of the detecting unit may be stored in the memory 137, instead of the information indicating whether the front-face unit 120 is in an open state or a closed state as shown in FIG. 12E, and the state of the front-face unit 120 may be determined from the detection results.

In such a case, when an open instruction is issued from a user, the output of a pulse signal to the stepping motor 190 is continued until the detecting unit determines that the front-face unit 120 is put into an open state.

Referring now to FIG. 13B, the controlling operation to be performed by the controller 140 when the connecting state of the portable device 10 with respect to the vehicle-mounted device 100 is changed is described. This controlling operation is started when the controller 140 determines that the power source of the vehicle-mounted device is switched on, and is continued while the power source of the vehicle-mounted device 100 is in an ON state.

First, the controller 140 determines whether there is a change in the connecting state of the portable device 10 to the vehicle-mounted device 100 (step S31). A change in the connecting state is detected in the following manner. The controller 140 transmits a connection signal to the controller 20 at regular intervals or in desired timing. If the controller 140 does not receive a response from the controller 20 to the latest transmission though there has been a response from the controller 20 to the previous transmission, the controller 140 determines that the portable device 10 has been detached from the vehicle-mounted device 100 (attachment to detachment). If the controller 140 receives a response from the controller 20 to the latest transmission though there has not been a response from the controller 20 to the previous transmission, the controller 140 determines that the portable device 10 is attached to the vehicle-mounted device 100 (detachment to attachment).

Alternatively, a change in the connecting state may be detected by checking the operating state of the detachment button 160, or a structure for detecting a change in the connecting state may be specially provided. Other methods and techniques may be utilized to detect a change in the connecting state.

If the controller 140 determines in step S31 that there is not a change in the connecting state of the portable device 10 to the vehicle-mounted device 100, the controller 140 repeats the procedure of step S31.

If the controller 140 determines in step S31 that the portable device 10 is detached from the vehicle-mounted device 100 (attachment to detachment), the controller 140 reads the current tilt angle $\theta$ and the open/closed state of the front-face unit 120 from the memory 137 (the table information shown in FIG. 12E), and determines the number of pulses to be output to the stepping motor 190 so as to displace the front-face unit 120 to the reference position, based on the read current tilt angle $\theta$ and open/closed state and the table information stored in the memory 137 and shown in FIGS. 12A, 12B, and 12C (step S32).

More specifically, if the front-face unit 120 is in an open state, the controller 140 determines the number of pulses to be output to the stepping motor 190 so as to displace the front-face unit 120 to the reference position (0°), based on the table information shown in FIGS. 12B and 12C. If the front-face unit 120 is in a closed state, the controller 140 determines the number of pulses to be output to the stepping motor 190 so as to displace the front-face unit 120 to the reference position (0°), based on the table information shown in FIGS. 12A and 12C.

As described above, the memory 137 stores the current tilt angle $\theta$ of the front-face unit 120 that is displaced by pressing the tilt/eject button 132a in the second mode (a tilt instruction), as shown in FIG. 12E.

Instead of the current tilt angle $\theta$, the information about the current tilt angle $\theta$ may be stored in the memory 137.

To displace the front-face unit 120 to the reference position, the controller 140 outputs a pulse signal having the pulses determined in step S32 to the stepping motor 190 (step S33). The stepping motor 190 then drives (pulls back) the slider 181 by an amount equivalent to-the number of pulses in the pulse signal supplied from the controller 140. Accordingly, the front-face unit 120 is displaced to the reference position (0°).

If the controller 140 determines in step S31 that the portable device 10 is attached to the vehicle-mounted device 100 (detachment to attachment), the controller 140 reads the current tilt angle $\theta$ and the open/closed state of the front-face unit 120 from the memory 137 (the table information shown in FIG. 12E), and determines the number of pulses to be output to the stepping motor 190 so as to displace the front-face unit 120 from the reference position to a position at the current tilt angle $\theta$ or a position in an open state, based on the read current tilt angle $\theta$ and the open/closed state of the front-face unit 120, and the table information stored in the memory 137 and shown in FIGS. 12A, 12B, and 12C.

More specifically, if the front-face unit 120 is in an open state before the displacement to the reference position, the controller 140 determines the number of pulses to be output to the stepping motor 190 so as to displace the front-face unit 120 to an open state, based on the table information shown in FIGS. 12B and 12C. If the front-face unit 120 is in a closed state before the displacement to the reference position, the controller 140 determines the number of pulses to be output to the stepping motor 190 so as to displace the front-face unit 120 to a closed state (at the current tilt angle $\theta$), based on the table information shown in FIGS. 12A and 12C.

Alternatively, the controller 140 may determine the number of pulses to be output to the stepping motor 190 so as to displace the front-face unit 120 to a closed state (at the current tilt angle $\theta$), regardless of whether the front-face unit 120 is in an open state or in a closed state before the displacement to the reference position.

As described above, the memory 137 stores the current tilt angle $\theta$ of the front-face unit 120 that is displaced by pressing the tilt/eject button 132a in the second mode (a tilt instruction), as shown in FIG. 12E.

Instead of the current tilt angle $\theta$, the information about the current tilt angle $\theta$ may be stored in the memory 137.

To displace the front-face unit 120 to a position in which the front-face unit 120 is located before the displacement to the reference position, the controller 140 outputs a pulse signal having the pulses determined in step S32 to the stepping motor 190 (step S35). The stepping motor 190 then drives (pushes out) the slider 181 by an amount equivalent to the number of pulses in the pulse signal supplied from the controller 140. Accordingly, the front-face unit 120 is displaced to the position in which the front-face unit 120 is located before the displacement to the reference position (before the detachment of the portable device 10).

To sum up, when the portable device 10 is detached from the vehicle-mounted device 100, the front-face unit 120 is displaced to the reference position (0°), and, when the portable device 10 is attached to the vehicle-mounted device 100, the front-face unit 120 is returned to the position in which the front-face unit 120 is located before the detachment.

The table information shown in FIG. 12C may not be stored in the memory 137, but a detecting unit (such as a limit switch) for detecting a state in which the front-face unit 120 is located in the reference position based on the amount of movement of the slider 181 or the like may be provided instead. In such a case, displacement of the front-face unit 120 to the reference position may be detected from the detection results of the detecting unit.

In such a case, when the portable device 10 is attached to the vehicle-mounted device 100, the output of a pulse signal to the stepping motor 190 is continued until the detecting unit determines that the front-face unit 120 is displaced to the reference position.

As described above in detail, in accordance with this embodiment, if detachment of the portable device 10 from the front-face unit 120 of the vehicle-mounted device 100 is detected (attachment to detachment), the stepping motor 190 is controlled so that the slider 181 in a sliding state is returned to the original state. Accordingly, when detachment of the portable device 10 from the front-face unit 120 of the vehicle-mounted device 100 is detected, the front-face unit 120 is returned from a tilting state to a non-tilting state (the reference position). When the portable device 10 is attached back to the front-face unit 120, the slider 181 is not in a sliding state. Accordingly, excess load is not put on the stepping motor 190, and damage to the stepping motor 190 and other components can be avoided. Also, since the front-face unit 120 is not in a tilting state, the portable device 10 can be readily attached to the vehicle-mounted device 100.

Also in accordance with the above described embodiment, when the slider 181 slides in the forward direction of the vehicle-mounted device main unit 110, the controller 140 stores the tilt angle of the front-face unit 120 in the memory 137. When detachment of the portable device 10 from the front-face unit 120 of the vehicle-mounted device 100 is detected, the controller 140 reads the tilt angle of the front-face unit 120 stored in the memory 137, and outputs a pulse signal according to the read tilt angle to the stepping motor 190. With this arrangement, the amount of sliding of the slider 181 in the forward direction of the vehicle-mounted device main unit 110 can be accurately stored as the tilt angle of the front-face unit 120. Also, when detachment of the portable device 10 from the front-face unit 120 is detected, the slider 181 can be moved only by the amount of sliding and be returned to the original position, with the use of the pulse signal according to the tilt angle of the front-face unit 120 stored in the memory 137.

Instead of the tilt angle of the front-face unit 120, the number of pulses in the pulse signal that is output to the stepping motor 190 may be stored in the memory 137. In such a case, the amount of sliding of the slider 181 can be accurately stored as the number of pulses, and the slider 181 can be moved only by the amount of sliding and be returned to the original position.

In the above described embodiment, the slider 181 is pushed out or retracted, based on the tilt angle of the front-face unit 120. However, a sensor that senses the amount of sliding (the amount of movement such as a distance) of the slider 181 may be provided in the vehicle-mounted device 100, and the slider 181 may be pushed out or retracted in accordance with the amount of sliding of the slider 181 detected by the sensor. In such a case, the amount of sliding of the slider 181 is stored in the memory 137. With this structure, the amount of sliding of the slider 181 in the forward direction of the vehicle-mounted device main unit 110 can be accurately stored. When detachment of the portable device 10 from the front-face unit 120 is detected, the slider 181 can be moved only by the amount of sliding and be returned to the original position.

The above described embodiment is merely an example of a preferred embodiment of the present invention. However, the present invention is not limited to that, and various changes and modifications may be made to it without departing from the principles and spirit of the invention.

For example, although a vehicle-mounted system formed with a vehicle-mounted device and a portable device has been described so far, the present invention is not limited to the vehicle-mounted system. Also, the portable device 10 may be a portable device such as a portable telephone device or a portable digital assistant (PDA) with navigating functions.

Further, instead of the CD insertion/ejection slit and the CD reproducing unit, it is possible to employ an insertion/ejection slit and a reproducing unit for other recording media such as MDs, DVDs, and SD cards. It is also possible to employ two or more insertion/ejection slits and two or more reproducing units for two or more recording media.

Also, the upper face portion provided on the upper face of the vehicle-mounted device (the electronic device) may be designed to stand vertically on the vehicle-mounted device main unit (the electronic device main unit).

Further, in the above described embodiment, tilting and opening/closing of the front-face unit 120 are controlled by handling only one button. However, it is possible to provide a button for a tilt instruction and a button for an open/close instruction, independently of each other.

The present application is based on Japanese Patent Application No. 2007-017042 filed Jan. 26, 2007, the entire disclosure of which is hereby incorporated by reference.

What is claimed is:

1. An electronic device comprising:
a main unit;
a cap unit that is capable of having a portable electronic device attached thereto and is capable of tilting;
a driving unit that causes the cap unit to tilt with respect to the main unit; and
a controlling unit that drives the driving unit so as to return the cap unit to a reference position, when detachment of the portable electronic device from the cap unit is detected, and drives the driving unit so as to return the cap unit to a position when the portable electronic device has been detached from the cap unit, when attachment of the portable electronic device to the cap unit is detected.

2. An electronic system comprising:
a portable electronic device; and
an electronic device that includes:
a main unit;
a cap unit that is capable of having a portable electronic device attached thereto and is capable of tilting;
a driving unit that causes the cap unit to tilt with respect to the main unit; and a controlling unit that drives the driving unit so as to return the cap unit to a reference position, when detachment of the portable electronic device from the cap unit is detected, and drives the driving unit so as to return the cap unit to a position when the portable electronic device has been detached from the cap unit, when attachment of the portable electronic device to the cap unit is detected.

3. The electronic device as claimed in claim 1, further comprising:

a storage unit that stores table information indicating a relationship among a number of times a button outputting an instruction that causes the cap unit to tilt with respect to the main body is pressed, a number of pulses of a pulse signal that is output from the controlling unit to the driving unit, a tilt angle of the cap unit in an open state, a tilt angle of the cap unit in the reference position, and a current tilt angle of the cap unit, wherein when detachment of the portable electronic device from the cap unit is detected, the controlling unit determines the number of pulses to be output to the driving unit so as to displace the cap unit to the reference position, the determined pulses based on the table information, the tilt angle of the cap unit in the reference position, and the current tilt angle of the cap unit, and outputs a pulse signal having the determined pulses to the driving unit, and when attachment of the portable electronic device to the cap unit is detected, the controlling unit determines the number of pulses to be output to the driving unit so as to displace the cap unit to a position when the cap unit is in the open state, the determined pulses based on the table information, the tilt angle of the cap unit in the open state, and the current tilt angle of the cap unit, and outputs a pulse signal having the determined pulses to the driving unit.

* * * * *